(12) United States Patent
Kochergin et al.

(10) Patent No.: US 7,560,018 B2
(45) Date of Patent: Jul. 14, 2009

(54) SEMICONDUCTOR ELECTROCHEMICAL ETCHING PROCESSES EMPLOYING CLOSED LOOP CONTROL

(75) Inventors: Vladimir Kochergin, Westerville, OH (US); Marc Christophersen, Westerville, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 449 days.

(21) Appl. No.: 11/038,500

(22) Filed: Jan. 21, 2005

(65) Prior Publication Data

US 2005/0199511 A1 Sep. 15, 2005

Related U.S. Application Data

(60) Provisional application No. 60/537,508, filed on Jan. 21, 2004.

(51) Int. Cl.
*B23H 3/02* (2006.01)
(52) U.S. Cl. .................. 205/645; 205/641; 205/646
(58) Field of Classification Search ............ 438/637, 438/687; 451/259; 205/641, 645, 646
See application file for complete search history.

(56) References Cited

U.S. PATENT DOCUMENTS

| | | | |
|---|---|---|---|
| 4,874,484 A | 10/1989 | Föll et al. | |
| 5,262,021 A | 11/1993 | Lehmann et al. | |
| 5,840,199 A * | 11/1998 | Warren | 216/2 |
| 5,987,208 A | 11/1999 | Gruning et al. | |
| 6,130,748 A | 10/2000 | Krueger et al. | |
| 6,750,153 B2 * | 6/2004 | Beetz et al. | 438/745 |
| 6,790,340 B1 * | 9/2004 | Izuo et al. | 205/655 |
| 6,808,840 B2 * | 10/2004 | Mallari et al. | 429/44 |
| 2002/0173252 A1 * | 11/2002 | Li | 451/259 |
| 2002/0192944 A1 * | 12/2002 | Sonderman et al. | 438/637 |
| 2002/0195610 A1 * | 12/2002 | Klosowiak | 257/98 |
| 2004/0055901 A1 * | 3/2004 | Petersen et al. | 205/789 |

FOREIGN PATENT DOCUMENTS

| | | |
|---|---|---|
| DE | 3717851 | 6/1987 |
| DE | 4202454 | 11/1993 |
| DE | 43 19 413.3 | 12/1997 |
| DE | 196 08 428 | 10/2000 |
| DE | 0010011253 A1 | 9/2001 |

OTHER PUBLICATIONS

V. Lehmann, H Foell, J. Electrochem. Soc., 137 (1990), p. 653.
J. Schilling et al., "Three-dimensional photonic crystals based on Macroporous silicon with modulated pore diameter", *Appl. Phys. Lett.* V 78, N.9, Feb. 2001.
H. Föll et. al, "Formation and application of porous silicon", *Mat. Sci. Eng.* R 39 (2002), pp. 93-141.
D.J. Lockwood et al., "Optical properties of porous GaAs," *Physica E*, 4, p. 102 (1999).
S. Langa et al., "Observation of crossing pores in anodically etched n-GaAs," *Appl. Phys. Lett.* 78(8), pp. 1074-1076, (2001).
B.H. Erne et al., "Porous Etching: A Means to Enhance the Photoresponse of Indirect Semiconductors," *Adv. Mater.*, 7, p. 739-742 (1995).
P.A. Kohl et al., "The Photoelectrochemical Oxidation of (100), (111), and (111)n-InP and n-GaAs," *J. Electrochem. Soc.*, 130, p. 2288-2293 (1983).
Schmuki P et al., *Physica Status Solidi A*, "Pore Formation on n-InP," 182 (1), pp. 51-61, (2000).
S. Langa et al., "Formation of Porous Layers with Different Morphologies during Anodic Etching of n-InP," *J Electrochem. Soc. Lett.*, 3 (11), p. 514-516, (2000).
J.v.d. Lagemaat, Utrecht, Thesis (1998).
S. Langa et al., *Phys, Stst. Sol.* (A), 195 (3), "Electrochemical pore etching in Ge," R4-R6 (2003).
H. Föll et al., "Porous III-V compound semiconductors: formation, properties, and comparison to silicon", *Phys. Stat. Sol. A*, 197 (1), pp. 61-70 (2003).
M. Christophersen et al., "A comparison of pores in silicon and pores in III-V compound materials", *Phys. Stat. Sol. A*, 197 (1), pp. 197-203, (2003).
H. Föll et al., "Pores in III-V Semiconductors", *Adv. Materials, Review*, 2003, 15, pp. 183-198, (2003).
G. Vincent, "Optical-properties of porous silicon superlattices", *Appl. Phys. Lett.*, 64 (18): 2367-2369 (May 1994).
M. Christophersen, et al., "Porous Silicon filters for mid-to-far IR range", SPIE 49th Annual Meeting, Denver, CO, USA Aug. 2004. Proc. SPIE vol. 5524, p. 158-168, Novel Optical Systems Design and Optimization VII; Jose M. Sasian, R. John Koshel, Paul K. Manhart, Richard C. Juergens; Eds. Oct. 2004.
S. Langa, J. Carstensen, M. Christophersen, and H. Föll, I.M. Tiginyanu, Self Induced Voltage Oscillations during Anodic Etching of n-InP and Possible Applications for Three-dimensional Micro Structures, Electrochem. Solid-State Lett., 4, G50 (2001).
J. C. Claussen, J. Carstensen, M. Christophersen, S. Langa, H. Föll, Oscillations, synchronization, and open-loop control in electrochemical semiconductor pore etching, Frühjahrstagung der Deutschen Physikalischen Gesellschaft, Mar. 11-15, Regensburg, Germany.
S. Langa et al., "Voltage oscillations—an emergent property at high density pore growth," Phys. Stat. Sol. A, 197 (1), pp. 186-191 (2003).

\* cited by examiner

*Primary Examiner*—Bruce F Bell
(74) *Attorney, Agent, or Firm*—Nixon & Vanderhye P.C.

(57) ABSTRACT

Methods and apparatus for providing closed-loop control over an electrochemical etching process during porous semiconductor fabrication enhance the quality of the porous semiconductor materials, especially those contained structural variations (such as porosity or morphology variations) along the thickness of said porous semiconductors. Such enhancement of the control over the electrochemical etching process is highly desired for many applications of porous semiconductor materials.

27 Claims, 6 Drawing Sheets

SEMICONDUCTOR ELECTROCHEMICAL ETCHING PROCESSES EMPLOYING CLOSED LOOP CONTROL

CROSS-REFERENCES TO RELATED APPLICATIONS

This application claims the benefit of provisional application 60/537,508 filed Jan. 21, 2004, incorporated herein by reference.

STATEMENT REGARDING FEDERALLY SPONSORED RESEARCH OR DEVELOPMENT

Not applicable.

FIELD

The technology herein relates to electrochemical or photoelectrochemical etching of semiconductor wafers that employ closed-loop control of pore geometry by detecting changes in the bath etch parameters and utilizing them, or derivations based on them, as closed loop feedback control parameters to obtain desired pore geometry. More particularly, this technology relates to methods of in-situ measurements of etch parameters and methods of extracting information from such measured parameters, and, further, in providing active feedback to the etching system, including changing of the etching parameters according to the results of the in-situ measurements.

BACKGROUND AND SUMMARY

Electrochemical etching of semiconductor materials in order to form porous semiconductor material structures is becoming well known and commonly practiced. A method for etching macropores (i.e., straight pores with diameters in the 100 nm to 100 μm range) in n-doped silicon was described in 1990 [V. Lehmann, H Foell, J. Elecrochem. Soc., 137 (1990), p. 653]. Since that time, such methods have been expanded to p-doped silicon and other semiconductor materials. Processes for the etching of mesoporous silicon (pore diameters in the 5 nm to 100 nm range) have been developed to various degrees as well.

Porous semiconductor technology has found applications in optics, micromachining, capacitors and Silicon-on-Insulator (SOI) fabrication, to name a few. However, current art methods of electrochemical etching of semiconductors are still not entirely satisfactory for at least some applications. Electrochemical dissolution of semiconductors is a complex process, strongly dependent on many parameters, e.g. current density, semiconductor wafer doping type and doping density, electrolyte composition, illumination intensity (if used) and/or temperature, to name a few. Many of the parameters change during the anodization process itself, especially in the case of etching very high aspect ratio pores (length to diameter of 50 to 200), which is often the case. There exist physical constraints that lead to the natural modification of the electrochemical etching parameters during the electrochemical etching process. These effects include changing pore growth parameters, including speed of the pore tips into the wafer, porosity (ratio of pore cross sectional area to total area), and others. From another point of view, many applications for porous semiconductor materials require tight control over the porous structure throughout the whole depth of the porous part of semiconductor wafer. In order to fulfill such demanding requirements, it has been found that closed-loop control utilizing active feedback of the etch parameters must be implemented in the electrochemical etching process. In other words, certain parameters of the electrochemical system need to be actively monitored, and some of the electrochemical etching parameters need to be actively adjusted according to the results of such a monitoring.

Information about manufacturing straight pore Macroporous Silicon (MPSi) arrays can be found in U.S. Pat. No. 5,262,021, issued to V. Lehmann et al. Nov. 16, 1993 (which claims priority to Fed. Rep. Of Germany Patent # 4202454, issued Jan. 29, 1992), in which a method for the formation of free-standing macropore arrays from an n-doped Si wafer is disclosed. Macroporous silicon layers with modulated pore diameters throughout the pore depth is disclosed in, for example, [U.S. Pat. No. 5,987,208 issued to U. Gruning and V. Lehmann et al. Nov. 16, 1999] or [J. Schilling et al., Appl. Phys. Lett. V 78, N.9, February 2001]. As disclosed in this prior art, changes of the etching parameters over the etching time severely limit the maximum obtainable thickness of the useful MPSi layer.

There are also several disclosures related to the method of manufacture of macroporous structures with controlled positions of the pores. One disclosure is U.S. Pat. No. 4,874,484 issued to H. Föll and V. Lehmann, issued Oct. 17, 1989 (which claims priority to Fed. Rep. Of Germany Patent # 3717851 dated May 27, 1987). This patent describes a method of fabricating MPSi arrays from n-doped, (100)-oriented silicon wafers in HF-based aqueous electrolytes (i.e., electrolytes based on hydrofluoric acid diluted with water) under the presence of backside illumination, and also describes a method of controlling the position of macropores through formation of etch-pits. Etch pits are typically, but not exclusively, pyramid-shaped openings formed on the silicon or other semiconductor surface that can be formed through mask openings upon exposure to anisotropic chemical etchants. In addition, the use of wetting agents (such as formaldehyde) and controlling the pore profile through chronologically-varying applied electrical potentials are disclosed. A detailed review of the various aspects of MPSi formation can be found in H. Föll et. al, Mat. Sci. Eng. R 39 (2002), pp. 93-141.

In addition to silicon, macropores have been produced in other types of semiconductor and ceramic materials. Macropores obtained in n-type GaAs by electrochemical etching in acidic electrolytes (aqueous HCl-based), were reported by, for example, D. J. Lockwood et al., Physica E, 4, p. 102 (1999) and S. Langa et al., Appl. Phys. Lett. 78(8), pp. 1074-1076, (2001). Macropores obtained in n-type GaP by electrochemical etching were reported by B. H. Erne et al., Adv. Mater. 7, p. 739 (1995). Macropore formation during the electrochemical etching of n-type InP (in aqueous and organic solutions of HCl and mixtures of HCl and $H_2SO_4$) was reported by P. A. Kohl et al., J. Electrochem. Soc., 130, p. 228 (1983) and more recently by P. Schmuki et al., Physica Status Solidi A, 182 (1), pp. 51-61, (2000); S. Langa et al., J. Electrochem. Soc. Lett., 3 (11), p. 514, (2000). Macroporous GaN formation during electrochemical etching was reported by J. v. d. Lagemaat, Utrecht (1998). Macropore formation during electrochemical etching of Ge was reported by S. Langa et al., Phys. Stat. Sol. (A), 195 (3), R4-R6 (2003). Reviews of macropore formation in III-V semiconductors can be found in H. Föll et al., Phys. Stat. Sol. A, 197 (1), p. 64, (2003); M. Christophersen et al., Phys. Stat. Sol. A, 197 (1), p. 197, (2003), and H. Föll et al., Adv. Materials, Review, 2003, 15, pp. 183-198, (2003).

Although etching mesoporous silicon layers has been known for many years, the interest in etching mesoporous structures with porosity modifications across the mesoporous layer depth arose only recently after the discovery of the possibility of the use of such material for optical filters (see, for example, G. Vincent, "Optical-properties of porous silicon superlattices", *Appl. Phys. Lett.*, 64 (18): 2367-2369, May 1994; foreign Application priority Jun. 14, 1993 [DE], 43 19 413.3; and U.S. Pat. No. 6,130,748 (issued Oct. 10, 2000 to M. Krueger et al., claiming priority to DE Patent 196 08 428 issued Mar. 5, 1996). Generally, mesoporous silicon is porous silicon material with pores in the range of 5 nm to 100 nm embedded in the silicon host. It can be obtained by electrochemically etching, in HF-containing electrolytes, highly doped silicon wafers (n-type or p-type) with resistivities typically in the range of 0.001-0.1Ω cm. A multilayer structure with different porosities in different layers can easily be obtained by temporal variations of the electrochemical etching parameters during the etching process. The most popular parameter used to control the porosity is the anodization current density. Differing porosities in different layers yield different refractive indices according to the porosity, so interference filters can be realized using this technique. Although in the majority of disclosures thus far, the depth of mesoporous layers was low enough (and, consequently, the time of the processing was fast enough) to develop the problems with changing of the electrochemical etching conditions, recently it was demonstrated that mesoporous multilayers can be etched several hundreds microns thick and can find applications in mid and far infrared filters [M. Christophersen, V. Kochergin, P. R. Swinehart, "Porous Silicon filters for mid-to-far IR range", SPIE 49th Annual Meeting, Denver, Colo., USA August 2004. *Proc. SPIE* Vol. 5524, p. 158-168, Novel Optical Systems Design and Optimization VII; Jose M. Sasian, R. John Koshel, Paul K. Manhart, Richard C. Juergens; Eds. October 2004]. During etching of such a deep mesoporous structure, strict control of porosity throughout the layer depth requires active adjustment of the electrochemical etching parameters, as in the case of macroporous silicon described above.

Several attempts to implement open-loop control (i.e., characterizing the electrochemical etching parameters and mathematically adjusting the process parameters with time, but with no real time parameter input) have been made recently. For example, in a number of publications ([S. Langa, J. Carstensen, M. Christophersen, and H. Föll, I. M. Tiginyanu, Self Induced Voltage Oscillations during Anodic Etching of n-InP and Possible Applications for Three-dimensional Micro Structures, *Electrochem. Solid-State Lett.*, 4, G50 (2001)], [J. C. Claussen, J. Carstensen, M. Christophersen, S. Langa, H. Föll, Oscillations, synchronization, and open-loop control in electrochemical semiconductor pore etching, Frühjahrstagung der Deutschen Physikalischen Gesellschaft, March 11-15, Regensburg, Germany], [S. Langa et al., *Phys. Stat. Sol. A*, 197 (1), pp. 186-191 (2003)]) it was observed that correlated voltage oscillations in certain macroporous systems during electrochemical processes take place, and the frequency of these oscillations was proposed as an open-loop control parameter. Particularly, it was disclosed that low frequency (below 100 Hz, in most cases below 10 Hz) voltage oscillations during electrochemical etching of p-doped Si, n-doped InP and GaP semiconductor materials, takes place during constant current electrochemical etching conditions, each with some characteristic oscillation frequency that is strongly dependent on the electrochemical etching parameters and strongly shifts with the time of electrochemical etching.

Another method of monitoring the anodization parameters during electrochemical etching of semiconductor materials has been disclosed in German patent DE0010011253A1 [Kontrollierte Porenätzung in Halbleitern, J. Carstensen, H. Föll, M. Christophersen, G. Hasse Veröffentlichungsnummer DE0010011253A1, Veröffentlichungsdatum Sep. 13, 2001]. In this patent it was proposed to use so-called impedance spectroscopy (i.e., to measure the complex resistance of the system at some frequency in the kHz range) to monitor the electrochemical etching. The idea was supported by an experimental plot, clearly indicating some changes in the real part of the impedance at a 2.6 kHz frequency.

From still another point of view, it is known to those skilled in the art that the electrochemical etching rate and the macropore cross-sections, for n-doped silicon etching in aqueous electrolyte and under the back-side illumination conditions, are both functions of a parameter designated as Jps, which is the value of the current density at the so-called "porous silicon peak" on the current-voltage (IV) curve. It was also noticed that the voltage and current positions of Jps are not constant during the electrochemical etching of deep macroporous layers. However, no closed-loop control over the electrochemical etching parameters has been found yet, based on these findings.

To summarize, despite the fact that some knowledge of electrochemical semiconductor etching processes has been developed over the last decade, a practical scheme (or schemes) for active feedback during electrochemical etching is needed in order to enhance the quality of porous semiconductor structures in order to meet the demands of certain applications.

The present exemplary illustrative non-limiting implementations provide a number of closed-loop control (active feedback) methods for the active monitoring of the electrochemical etching parameters during etching of semiconductor materials and to actively adjust other electrochemical etching parameters, wherein said adjustment is based on the results of said monitoring in order to produce porous semiconductor structures with well controlled parameters (such as pore sizes, morphology or porosity) throughout the entire depth of said porous semiconductor layers.

The present exemplary illustrative non-limiting implementations provide said closed-loop control for different types of semiconductors (e.g., Si, Ge, III-V compound semiconductors) and for different levels and types of doping of said semiconductors. Control over the semiconductor electrochemical etching process can be realized by:

measuring the present value of the resistivity (or conductivity) of the electrochemical system composed of the semiconductor wafer (anode), electrolyte and cathode electrode; and/or adjusting the electrochemical etching parameters according to the detected changes in said value of the resistivity (or conductivity) of said electrochemical system occurring during the electrochemical etching process at least once.

Said electrochemical etching parameters that can be adjusted include, but are not limited to, the applied current density, the time constant of electrical current modulation, the amplitude of said current modulation and the temperature of the electrolyte. The said time constant of electrical current modulation is particularly important if any type of multilayer structure is to be formed. Said semiconductor wafer can be a p-doped, (100)-oriented, single-crystal silicon wafer with resistivity in the range of 1 and 1000 Ωcm, said electrolyte can be an HF (hydrofluoric acid)-based electrolyte and said electrochemical etching can be done in the galvanostatic mode (or, in other words, in the current-control mode, when the applied current at any given point of time is set to some value, and the applied voltage is changing to any value needed to achieve said value of applied current). Said porous layer in this case will be macroporous silicon layer and said current modulation can be used to coherently modulate the diameters of said macropores. Said resistivity (or conductivity) measurements can be performed by setting a certain value of current density (in relation to the active area of the semiconductor wafer), recording the voltage needed to achieve said current density, dividing the current density into the voltage, comparing the obtained resistance density number with the stored value either obtained at the beginning of the electrochemical process or determined during calibration runs, and subsequently adjusting an electrochemical etching parameter. The time constant of current modulation can be taken as a nonlimiting example of said parameter adjustment. Alternatively, said semiconductor wafer can be p-doped, (111)-oriented single-crystal silicon wafer with a resistivity in the range of 1 to 1000 Ωcm, said electrolyte can be an HF (hydrofluoric acid)-based electrolyte and said electrochemical etching can be accomplished in the galvanostatic mode. Said porous layer in this case will be a macroporous silicon layer and said current modulation can be used to coherently switch the morphology of said macropores (between current-oriented pores and crystallographically-oriented pores). Alternatively, said semiconductor wafer can be a p-doped or an n-doped (100)- or (111)-oriented single-crystal wafer of a III-V compound semiconductor (for example, InP, GaAs or GaP) with doping density in the range of $10^{16}$-$10^{18}$ cm$^{-3}$, said electrolyte can be an acidic electrolyte and said electrochemical etching can be done in the galvanostatic or potentiostatic modes. Said porous layer in this case will be a macroporous semiconductor layer and said current modulation can be used to modulate either the diameters of the macropores or the morphology of the porous layer (switching the morphology between current-oriented pores and crystallographically-oriented pores). In the latter case either the time constant of the current modulation can be adjusted according to resistivity (or conductivity) measurements or the mode of electrochemical etching can be switched between the potentiostatic and galvanostatic modes. Alternatively, said semiconductor wafer can be a p-doped or n-doped (100)- or (111)-oriented single-crystal silicon wafer with resistivity in the range of 1 to 999 mΩcm, said electrolyte can be an HF (hydrofluoric acid)-based electrolyte and said electrochemical etching can be done in the galvanostatic mode. Said porous layer in this case will be a mesoporous silicon layer and said current modulation can be used to modulate the porosity of the porous layer.

According to a second exemplary illustrative non-limiting implementation, closed-loop control over the semiconductor electrochemical etching process can be realized by:

determining the frequency of self-induced voltage oscillations of a system consisting of a semiconductor wafer (anode), an electrolyte bath in contact with the first surface of said wafer, a counter electrode (cathode) in contact with the electrolyte bath opposite to said wafer, said system being operated in the galvanostatic mode at least during said determination procedure of said frequency.

adjusting the electrochemical etching parameters according to the detected changes in said frequency of said self-oscillations of said electrochemical system, as occur during the electrochemical etching process.

Said electrochemical etching parameters that can be adjusted include, but are not limited to, the applied current density, the time constant of current modulation (if a multilayer structure of alternating or varying porosities is to be formed in said semiconductor wafer, amplitude of said current modulation, and the temperature of the electrolyte(s). Said semiconductor wafer can be a p-doped, (100)-oriented single-crystal silicon wafer with resistivity in the range of 1 and 1000 Ωcm and said electrolyte can be an HF (hydrofluoric acid)-based electrolyte. Said porous layer in this case will be a macroporous silicon layer and said current modulation can be used to coherently modulate the diameters of said macropores. Said measurements of frequency of voltage self-oscillations (which is typically in the range of 1 mHz to 100 Hz) can be performed by setting a certain value of current density, recording the temporal dependence of the voltage needed to achieve said current density over at least the time equal to several periods of said voltage self oscillations, and mathematically processing said recorded data in order to extract said self-oscillation frequency and phase. As a nonlimiting example of said current-modulated electrochemical process, said frequency can be recorded at least once during each cycle of current modulation and the electrochemical etching parameters (such as amplitude of said current modulation, or frequency of said current modulation) can be adjusted according to the detected changes to the measured frequency of said voltage self-oscillations. According to a further aspect of the second exemplary illustrative non-limiting implementation, said frequency of the voltage self-oscillations of the electrochemical system consisting of the semiconductor wafer as one electrode, a counter electrode, and with electrolyte between them, can be determined by adding a small perturbation to the applied current (in the galvanostatic mode) and scanning the frequency of said perturbation signal within some frequency range, and further detecting the amplitude and/or the phase of the recorded voltage response of said electrochemical system. The range of scanned frequencies can be either near the main frequency of said voltage self-oscillations or near some of the higher harmonics of said frequency. Detection of the frequency and/or phase of the response around higher harmonics can be more convenient from instrumental point of view since the main frequency of self-oscillations can be quite low for certain combinations of semiconductor wafers and electrolytes, for instance, in the mHz range. Alternatively, said semiconductor wafer can be a p-doped, (111)-oriented single-crystal silicon wafer with resistivity in the range of 1 to 1000 Ωcm, said electrolyte can be an HF (hydrofluoric acid)-based electrolyte and said electrochemical etching can be performed in the galvanostatic mode. Said porous layer in this case will be a macroporous silicon layer, and said current modulation can be used to coherently switch the morphology of said macropores between current-oriented pores (i.e., pores are directed along the current lines, typically perpendicular to the wafer surface) and crystallographically-oriented pores (i.e., pores directed along some preferred crystallographic directions, often at some angle with respect to the wafer surface). Alternatively, said semiconductor wafer can be a p-doped or an n-doped (100)- or (111)-oriented single-crystal wafer of III-V compound semiconductor (for example, InP, GaAs or GaP) with doping density in the range of $5\times10^{15}$-$5\times10^{18}$ cm$^{-3}$, said electrolyte can be an acidic electrolyte and said electrochemical etching can be performed in the galvanostatic and/or potentiostatic modes. Said porous layer in this case will be a macroporous semiconductor layer, and said current modulation can be used to modulate either the diameters of the macropores or the morphology of the porous layer, again switching the morphology between current-oriented pores and crystallographically-oriented pores. In the latter case, either the time constant of the current modulation can be adjusted according to self-oscillation frequency measurements or the electrochemical etching can be switched between the potentiostatic and galvanostatic modes.

According to a third exemplary illustrative non-limiting implementation, closed-loop control over the semiconductor electrochemical etching process can be realized by
- recording the IV (current-voltage) curve such that the process of IV curve acquisition is much faster than the overall electrochemical etching process time,
- applying signal processing in order to extract the current and voltage values at the Jps peak contained in the recorded IV curve, and
- adjusting the electrochemical etching parameters according to the detected changes in said values of voltage and current that occur at the Jps peak during the electrochemical etching process.

Said electrochemical etching parameters that can be adjusted include, but not limited to, the applied current density, illumination intensity, time constant of current, voltage and/or illumination intensity modulation (if porosity multilayer is to be formed in said semiconductor wafer), amplitude of said current, voltage and/or illumination intensity modulation, temperature of the electrolyte. Said semiconductor wafer can be n-doped (100)-oriented single-crystal silicon wafer with resistivity in the range of 0.1 to 100 Ωcm, said electrolyte can be an HF (hydrofluoric acid)-based electrolyte and said electrochemical etching can be accomplished in the potentiostatic mode. Said porous layer in this case will be a macroporous silicon layer and said current modulation required for said coherent modulation of macropore diameters can be achieved by means of temporal modulations of illumination intensity and/or applied voltage. Said IV curve measurements can be performed then as follows: The illumination intensity can be fixed at some reasonably high value during the measurements and the applied voltage can be scanned while recoding the resultant current flowing through the system. It is essential in such measurements that the voltage scan rate (and the overall measurement time) is fast enough not to cause a disturbance in the pore growth. If the illumination intensity was set to high enough value and the silicon wafer is of good enough quality (i.e. the minor carrier diffusion length is high enough), the IV curve will then contain a pronounced peak, which is known as Jps peak. It's voltage and current positions can be determined by an appropriate mathematical algorithm, which can include, as a non-limiting example, polynomial or other non-physical (purely mathematical) curve fitting, or, as a second nonlimiting example, fitting with a physically-based theory. The determined values of the voltage and current positions of the Jps peak then can be compared to the reference values (which could be either obtained at the beginning of the process or can be preliminarily determined through calibration runs), and the electrochemical process parameters can then be adjusted accordingly. Said electrochemical etching parameters that can be adjusted include but not limited to the time constant of current modulation by means of varying the time constant of the illumination intensity modulation and/or applied voltage modulation, the amplitude of illumination intensity and the amplitude of applied voltage. Alternatively, said semiconductor wafer can be a p-doped or an n-doped (100)- or (111)-oriented single-crystal wafer of III-V compound semiconductor (for example, InP, GaAs or GaP) with doping density in the range of $10^{16}$-$10^{18}$ cm$^{-3}$. Said electrolyte can be an acidic electrolyte and said electrochemical etching can be done in the galvanostatic or potentiostatic mode. In the latter case, said IV curve can be obtained in a potentiostatic mode with or without back- or front-side illumination by simply scanning the voltage and recording the values of the current and subsequently applying signal processing and electrochemical parameter adjustment, as previously described. The time of IV testing must be carefully optimized in this case since it may cause considerable effect on the results. Dependence of the IV curve shape on a speed of scanning was observed if said speed of scanning is below some characteristic response time of the system, which varies is a wide range for different semiconductor material/electrolyte combinations and typically is in the range of several seconds. The time of IV curve recording should be slower, though, than the characteristic etching process time in order not to interfere with the pore growth.

BRIEF DESCRIPTION OF THE DRAWINGS

These and other features and advantages provided by exemplary non-limiting illustrative implementations will be better and more completely understood by referring to the following detailed description in connection with the drawings, of which.

DETAILED DESCRIPTION

According to the first exemplary illustrative non-limiting implementation, the closed-loop control over the semiconductor electrochemical etching process can be realized by
- measuring the present value of the resistivity (or conductivity) of the semiconductor wafer/electrolyte/electrode electrochemical system adjusting the electrochemical etching parameters automatically and continuously or quasi-continuously, according to the detected changes in said value of the resistivity (or conductivity) of said electrochemical system occurring during the electrochemical etching process.

Figure 1:
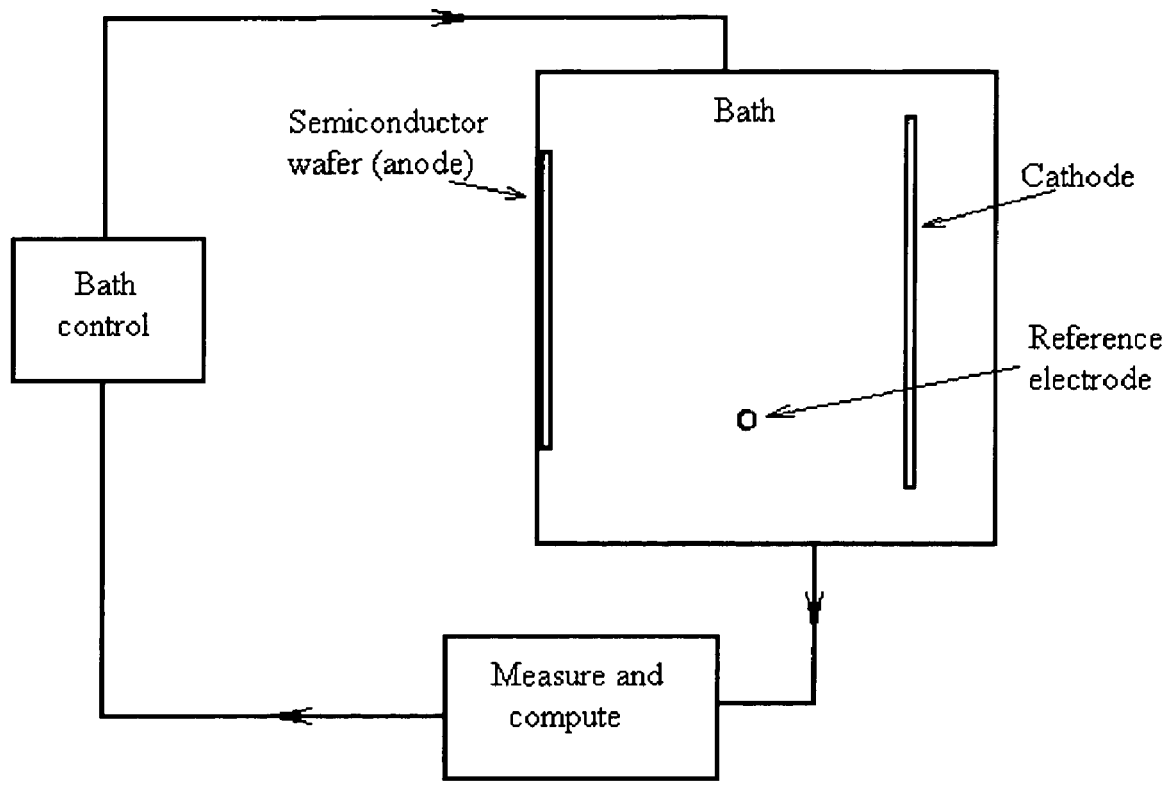
FIG. 1 shows a block-diagram of an exemplary illustrative non-limiting closed-loop control scheme.

Said electrochemical etching parameters that could be adjusted, in the case of a porous multilayer of varying porosities being formed in said semiconductor wafer, include, but are not limited to, the applied current density, time constant of current modulation, amplitude of said current modulation, and temperature of said electrolyte. The schematic block-diagram of the closed-loop control scheme is given in FIG. 1. Said semiconductor wafer can be a p-doped, (100)-oriented single-crystal silicon wafer with a resistivity in the range of 1 to 1000 Ωcm, said electrolyte can be an HF (hydrofluoric acid)-based electrolyte and said electrochemical etching can be done in the galvanostatic mode. Said porous layer in this case will be macroporous silicon layer and said current modulation can be used to coherently modulate the diameters of said macropores. Said resistivity (or conductivity) measurements can be performed by setting a certain value of current density, recording the voltage needed to achieve said current density, dividing these values, comparing the so-obtained number with a stored value either measured at the beginning of the electrochemical process or preliminarily determined (through calibration runs), and adjusting the electrochemical etching parameter, which may be, as a nonlimiting example, the time constant of current modulation.

Figure 2A:
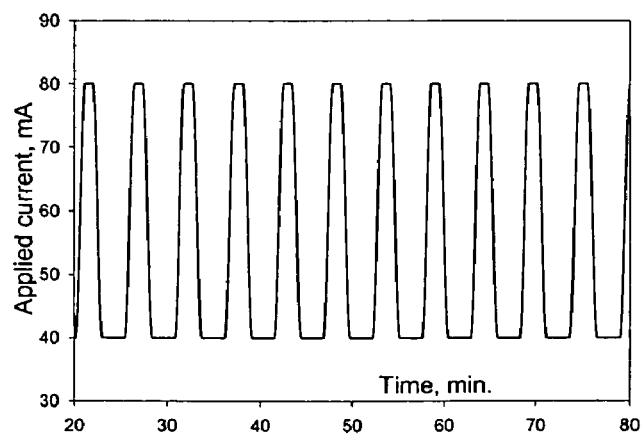
FIG. 2(a) shows an exemplary prior art plot of the time dependence of the applied current in the constant period current modulation case.
Figure 2B:
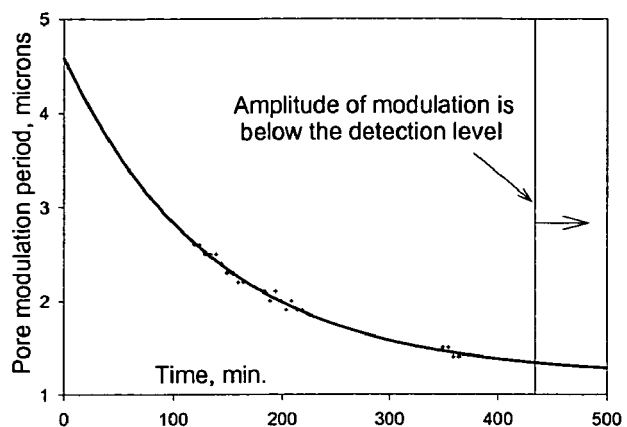
FIG. 2(b) shows an exemplary prior art plot of observed pore diameter modulation periods.
Figure 2C:
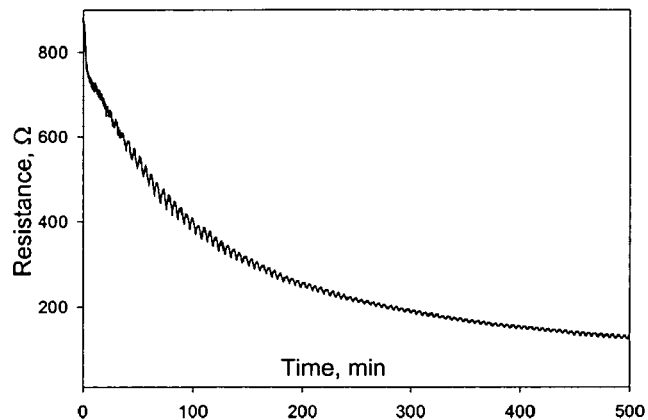
FIG. 2(c) shows an exemplary time dependence of the resistance during the process of anodization of a semiconductor wafer (as in FIG. 2b)
Figure 3A:
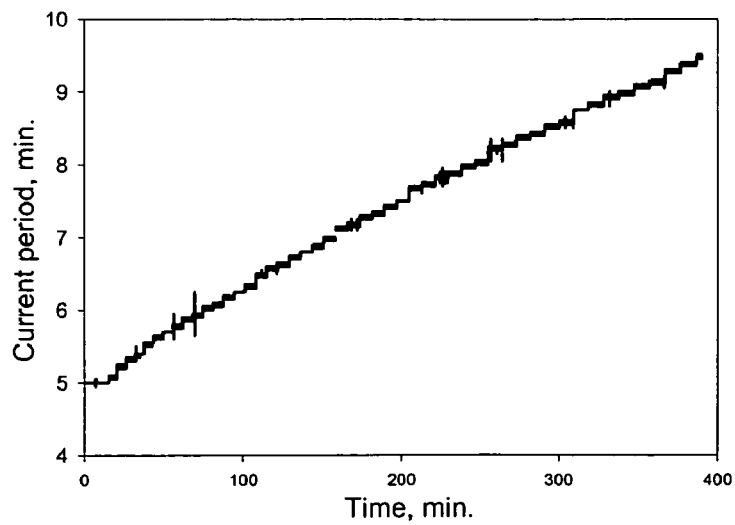
FIG. 3(a) is an exemplary plot of the time dependence of the current modulation period in closed-loop control mode.
Figure 3B:
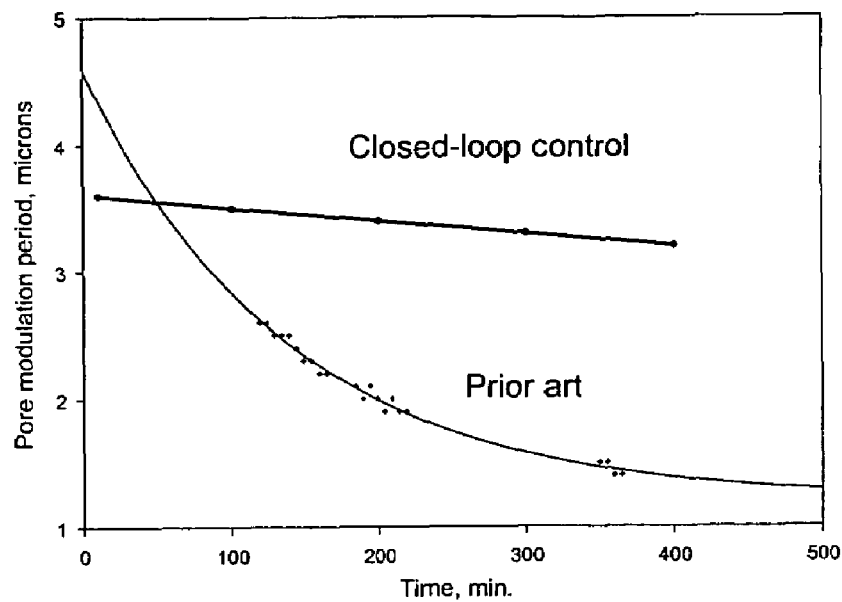
FIG. 3(b) shows an exemplary plot of pore modulation periods obtained in constant current modulation mode and closed-loop control mode.

As a nonlimiting example of a realization of this mode of the present exemplary illustrative non-limiting implementation, a macroporous silicon layer was fabricated without closed-loop control (according to prior art methods of fabrication) and with the closed-loop control method of the present exemplary illustrative non-limiting implementation. Initially, constant-period current modulations (such as shown in FIG. 2a) were applied during the electrochemical etching of a 67 Ωcm, p-doped Si wafer processed in electrolyte having the composition 25 parts HF/80 parts Ethanol/160 parts DMSO (Dimethylsulfoxide). Several characteristics were defined. First, the etch-rate was found to decrease with time, thus causing a monotonic change of the period of modulation across the pore depth. This is shown in FIG. 2b. Another characteristic that was encountered was the decrease of the pore diameter modulation amplitude with the pore depth (i.e., with the spatial frequency of the pore modulation). As illustrated in FIG. 1b for ~3.6 μm diameter pores, the amplitude of the pore diameter modulation became undetectable at a pore modulation period of ~1.3 μm. During this process, the resistance of the etching system was actively measured and recorded (results of measurements are given in FIG. 2c). It was also noted that the resistance $R(t,I(t))=U(I,t)/I(t)$, wherein $U(I,t)$ is applied voltage required to achieve the value of applied current $I(t)$ at time t, behaves in a similar manner to the silicon anodization rate, and through that, to the pore diameter modulation period. In the next experiment, the resistance was used as an active feedback parameter in a following fashion: The time span, T, between any two points of the applied current waveform was continuously adjusted according to the measured resistivity of the solution to: $T(t)=T(t_0) \cdot R(t,I_0)/R(t_0,I_0)$, wherein $t_0$ stands for the temporal point of reference, which was set to 10 minutes after start of the electrochemical etching process and $I_0$ stands for the reference current value which was in this case 40 mA. FIG. 3a gives the experimental dependence of the current modulation period with respect to time for a 71 Ωcm, p-doped Si wafer. It was processed in an electrolyte with a composition 25 parts HF/80 parts Ethanol/160 parts DMSO. FIG. 3b shows the pore modulation periods in constant current modulation mode and closed-loop control mode according to the first exemplary illustrative non-limiting implementation. A significant improvement in the pore modulation uniformity has been achieved with this method of closed-loop control of the semiconductor electrochemical etching parameters, compared to the prior art technique.

In this non-limiting, illustrative example, only the time between points of the applied current waveforms (i.e., temporal characteristics of external parameter modification) has been used as a changing parameter in the feedback. However, it should be understood that preferred exemplary illustrative implementation can include more than one parameter adjustment. As a nonlimiting example, the current modulation magnitude in the waveform and/or the temperature of the electrolyte can be also adjusted in real time according to the resistivity measurements. Moreover, the composition of the electrolyte can be also adjusted, according to resistivity measurements, by means of actively pumping small volumes of high concentration HF into the bath in order to compensate for the HF dissolution occurring during the anodization process. Also, since resistivity, to a first order approximation, is proportional to the pore etching rate (and vice versa), the exact information on the depth of the porous semiconductor layer at any point in time can be easily determined according to the formula $$D_{n+1} = \beta \cdot \sum_{j=0}^{n} R_j \cdot \Delta t_j,$$

where D is the depth, $R_j$ is the resistivity taken at the moment $t_j$ and stored in a table, $\Delta t_j$ is the temporal interval between resistivity measurements and β is the scaling constant, which can be easily predetermined by means of calibration.

Alternatively, said semiconductor wafer can be a p-doped, (111)-oriented single-crystal silicon wafer with a resistivity in the range of 1 to 1000 Ωcm, said electrolyte can be an HF (hydrofluoric acid)-based electrolyte and said electrochemical etching can be performed in the galvanostatic mode. Said porous layer in this case will be a macroporous silicon layer and said current modulation can be used to coherently switch the morphology of said macropores between current-oriented pores and crystallographically-oriented pores. For such a material etched in aqueous electrolytes with proper organic additions, high current densities result in current-oriented pores growing perpendicularly to the wafer surface (i.e., in the [111] crystallographic direction) while smaller current densities result in pores growing preferentially in the three [100] crystallographic directions. Modulating the current in such a system would result not only in layers of different porosity, but also in layers with different types of optical anisotropy, potentially important for a number of optical applications. The same kind of resistivity-based, closed-loop control can be implemented with such an etching system similarly to the case described above. Alternatively, said semiconductor wafer can be a p-doped or an n-doped, (100)- or (111)-oriented single-crystal wafer of III-V compound semiconductor (for example, InP, GaAs or GaP) with doping density in the range of $10^{16}$-$10^{18}$ cm$^{-3}$, said electrolyte can be an acidic electrolyte (containing HCl, $H_2SO_4$ or $H_3PO_4$ acids diluted with water) and said electrochemical etching can be accomplished in the galvanostatic or potentiostatic modes. Said porous layer in this case will be a macroporous semiconductor layer (with pores typically having submicron cross-sections) and said current modulation can be used to modulate either the diameters of the macropores or the morphology of the porous layer. This can be accomplished by switching the morphology between current-oriented pores and crystallographically-oriented pores, as can be done with (100)-oriented InP or GaAs wafers. In the latter case, either the time constant of the current modulation can be adjusted according to resistivity (or conductivity) measurements or the mode of electrochemical etching can be switched between the potentiostatic and galvanostatic modes. Alternatively, said semiconductor wafer can be a p-doped or an n-doped, (100)- or (111)-oriented, single-crystal silicon wafer with resistivity in the range of 1 to 999 m$\Omega$cm, said electrolyte can be an HF (hydrofluoric acid)-based electrolyte and said electrochemical etching can be accomplished in the galvanostatic mode. Said porous layer in this case will be mesoporous silicon layer and said current modulation can be used to modulate porosity of the porous layer. In this case, the employed method of closed-loop control is essentially the same, but the control should be performed typically faster (preferentially with less than 5 seconds time constant) than in the macroporous cases disclosed above.

According to the second exemplary illustrative non-limiting implementation, closed-loop control over the semiconductor electrochemical etching process can be realized by determining the frequency of self-induced voltage (or conductance) oscillations of the semiconductor wafer (anode), electrolyte, counter electrode(cathode) system operated in the galvanostatic mode, and adjusting the electrochemical etching parameters according to the detected changes in said frequency of said voltage (or conductance) self-oscillations of said electrochemical system occurred during the electrochemical etching process.

Figure 4:
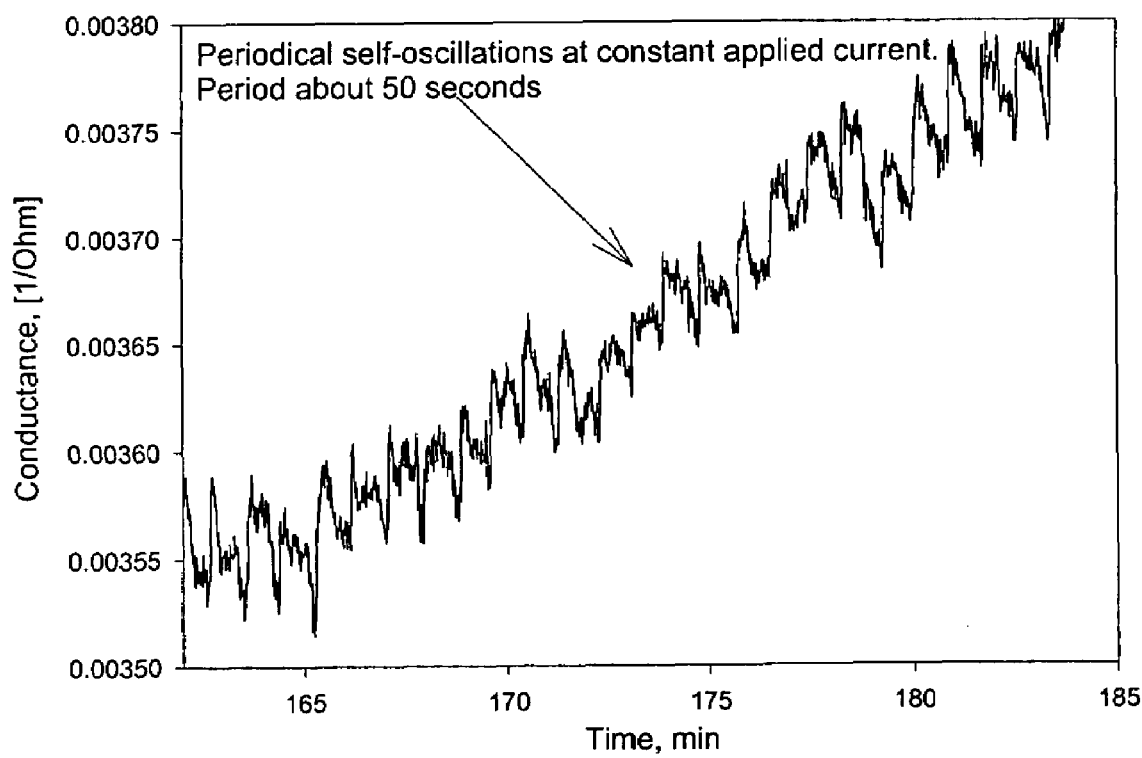
FIG. 4 is an exemplary plot of self-oscillations of the conductance during p-doped silicon electrochemical etching in a galvanostatic mode.

Said electrochemical etching parameters that can be adjusted include, but are not limited to, the applied current density, the time constant of current modulation (if a multilayer structure composed of layers with differing porosities is to be formed in said semiconductor wafer), the amplitude of said current modulation, and the temperature of the electrolyte. Said semiconductor wafer can be a p-doped, (100)-oriented single-crystal silicon wafer with resistivity in the range of 1 to 1000 $\Omega$cm and said electrolyte can be an HF (hydrofluoric acid)-based electrolyte. Said porous layer in this case will be macroporous silicon layer and said current modulation can be used to coherently modulate the diameters of said macropores (i.e., to form a porosity multilayer structure). Said measurements of the frequency of voltage self-oscillations (which is typically in the range of 1 mHz to 100 Hz) can be performed by setting a certain value of current density, recording the temporal dependence of the voltage needed to achieve said current density over at least a time equal to several periods of said voltage self-oscillations, and mathematically processing said recorded data in order to extract said self-oscillation frequency. Said voltage (or conductance) self oscillations present a resonance in the electrochemical etching conditions, providing resonant sensitivity of the resonance parameters (such as frequency and amplitude) to the etching conditions (such as, for a nonlimiting example, temperature, electrolyte composition, wafer doping density, current depth of the etched porous semiconductor layer, etc.). An exemplary experimental plot of the self-oscillations of conductivity in a galvanostatic etching experiment with p-doped Si is given in FIG. 4. The wafer was a p-doped, (100)-oriented silicon wafer with resistivity of 67 $\Omega$cm, processed in electrolyte having composition 20 parts HF/80 parts Ethanol/ 160 parts DMSO, with a current density of 3.47 mA/cm$^2$. Self-oscillations are clearly visible. The monitoring of the present state of the electrochemical etching system and, thus, a closed-loop control method is convenient to base on the frequency of self-oscillations. According to the first aspect of an exemplary, non-limiting illustrative implementation, the frequency of self-oscillations is determined in real time by recording continuously the voltage in the galvanostatic mode and actively performing analyses of at least some part of the stored data, followed by feeding the resultant signal back to the control point. Said analysis can comprise, as an exemplary non-limiting example, discrete Fourier transforms, wavelet transforms, curve fitting or any other suitable method of data processing known to those skilled in the art. The electrochemical etching parameters are then adjusted according to a comparison of the frequency of self-oscillations measured in real time with either some stored value or the initial value of said frequency recorded at the beginning of the electrochemical etching process. Alternatively, said electrochemical etching parameter adjustment can be performed based on the automatic mathematical comparison of said self-oscillation frequency, determined in real time, and the previously stored value of said frequency. Said parameters that can be actively changed according to the detected frequency can include one or more parameters, selected from the group consisting of applied current density, applied voltage, illumination intensity, temperature of the system, electrolyte composition (by means of the addition of chemicals into the electrolyte bath during the electrochemical etching process) and characteristic time (such as the period of some parameter modulation, as could be used in diameter- or porosity-modulated porous semiconductor layers).

According to a further aspect of an exemplary, illustrative, non-limiting implementation, the frequency of the self-oscillations can be determined by applying a small amplitude perturbation on the applied current and scanning the frequency of said perturbation signal within some frequency range and detecting the amplitude and/or the phase of the recorded voltage response of the system. The range of scanned frequencies can be either around the main frequency of said self-oscillations or around some of the higher harmonics of said frequency. Detection of the frequency and/or phase of the response around higher harmonics of the resonance can be more convenient from instrumental point of view since the main frequency of self-oscillations can be low (in the mHz range). In addition to the previously disclosed, (100)-oriented, p-doped silicon wafer, such a method of closed-loop control over the electrochemical etching process can be used with other types of semiconductor materials, such as p-doped, (111)-oriented single-crystal silicon wafers with resistivities in the range of 1 to 1000 $\Omega$cm, said electrolyte can be an HF (hydrofluoric acid)-based electrolyte and said electrochemical etching can be performed in the galvanostatic mode. Further, in the feedback controlled anodic etching of a p-doped or an n-doped (100)- or (111)-oriented, single-crystal wafer of a III-V compound semiconductor (for example, InP, GaAs or GaP), with doping density in the range of $10^{16}$ to $10^{18}$ cm$^{-3}$, said electrolyte can be an acidic electrolyte and said electrochemical etching can be done in the galvanostatic and/or potentiostatic modes.

According to the third exemplary illustrative non-limiting implementation, closed-loop control over the semiconductor electrochemical etching process can be realized by recording the IV (current-voltage) curve such that the process of IV curve acquisition is much faster than the overall electrochemical etching process time, applying signal processing in order to extract the current and voltage values at the Jps peak contained in the recorded IV curve, and adjusting the electrochemical etching parameters according to the detected changes in said values of voltage and current at the Jps peak as it occurs during the electrochemical etching process.

Figure 5A:
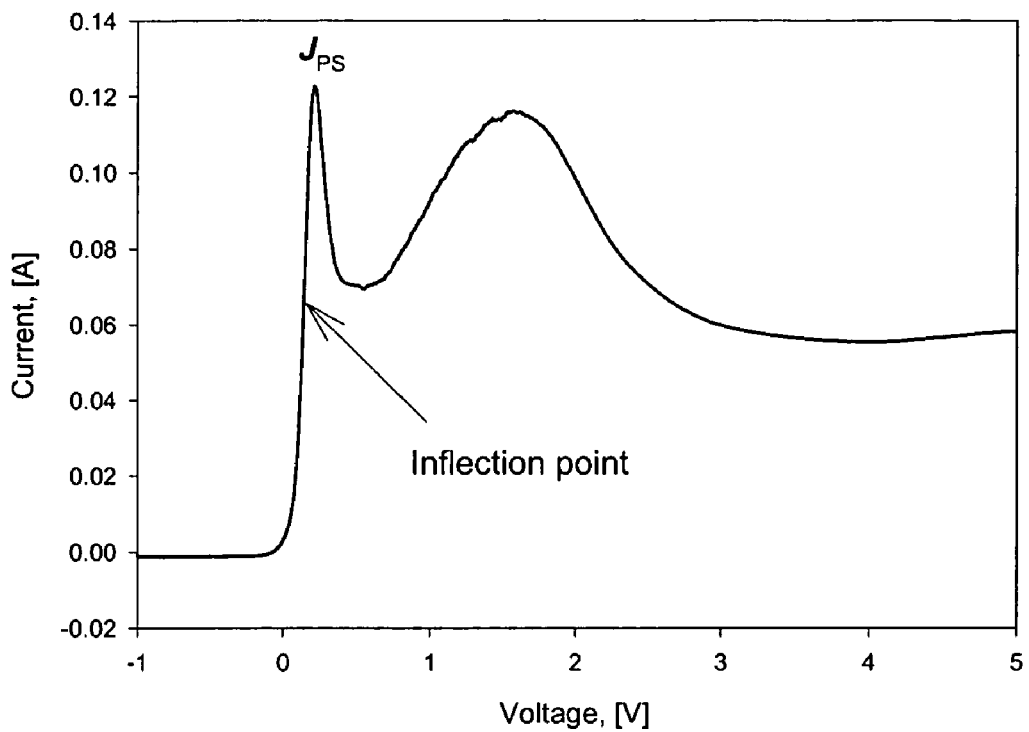
FIG. 5a is an exemplary IV curve obtained in an HF-based aqueous electrolyte and n-doped, (100)-oriented silicon wafer system, showing $J_{ps}$ and a point of inflection of the IV curve.

Said electrochemical etching parameters that can be adjusted include, but are not limited to, the applied current density, illumination intensity, time constant of all or any of the current, voltage and/or illumination intensity modulation (if a multilayer of porous layers of varying or alternating porosities is to be formed in said semiconductor wafer), amplitude of said current, voltage and/or illumination intensity modulation, or temperature of the electrolyte. Said $J_{PS}$ peak corresponds to the critical current density at the pore tip. $J_{PS}$ is the first maximum in the IV curve (under anodic polarization of the silicon electrode) of the electrolyte/semiconductor wafer system, and said $J_{PS}$ peak current and voltage position measurements can be used for active adjustment of some parameters of the anodization process. As a nonlimiting example, FIG. 5a gives typical IV (current-voltage) characteristics of an aqueous, HF-based electrolyte (with HF concentration in the range of 2 to 10 volume percent) and an n-doped, (100)-oriented Si wafer with resistivity in the range typically from 0.1 Ωcm to 20 Ωcm system. The $J_{PS}$ peak is clearly seen. Similar characteristic curves can be obtained in other electrolyte/semiconductor wafer combinations as well, such as p-doped or n-doped (100)- or (111)-oriented single-crystal wafers of III-V compound semiconductors (for example, InP, GaAs or GaP), with doping densities in the range of $10^{16}$ to $10^{18}$ cm$^{-3}$, in which said electrolyte can be an acidic electrolyte.

Since the critical current at the pore tips strongly depends on the electrochemical etching parameters, it can serve for in-situ measurements to monitor the current state of the system and as a basis for closed-loop control of the electrochemical etching process parameters. Measurement and adjustment of the system parameters can be done as follows: During the course of electrochemical etching, the IV curve can be recorded at certain times when the adjustment of the parameters or monitoring of the system state is desired. Then, mathematical analyses of the recorded data can provide the exact voltage and current position of the $J_{PS}$ peak. Said mathematical processing, as a nonlimiting illustrative example, can include curve fitting, polynomial interpolation or any other suitable method known to those skilled in the art. The current at the $J_{PS}$ peak at any given moment of time, for example, is proportional to the pore etching rate, so the depth of the etched porous semiconductor can be approximately determined at any given time according to the formula $$D_{n+1} = \gamma \cdot \sum_{j=0}^{n} J_{PSj} \cdot \Delta t_j,$$

where D is the depth, $J_{PSj}$ is the $J_{PS}$ peak taken at the moment $t_j$ and stored, $\Delta t_j$ is the temporal interval between IV curve measurements and γ is the scaling constant, which can be easily determined through calibration. In addition, the decrease of the acid concentration due to the semiconductor dissolution reaction can be actively determined according to the known volume of the dissolved semiconductor (equal to $$V_{n+1} = \vartheta \cdot \sum_{j=0}^{n} J_{PSj} \cdot P_j \cdot \Delta t_j,$$

with $P_j$ being the porosity of the porous semiconductor layer at the time of IV curve measurement, which also can be determined in many cases from the value of applied current and $J_{PS}$ peak value). Other parameters of the electrochemical etching system can be determined and actively adjusted by the same method as well.

Figure 5B:
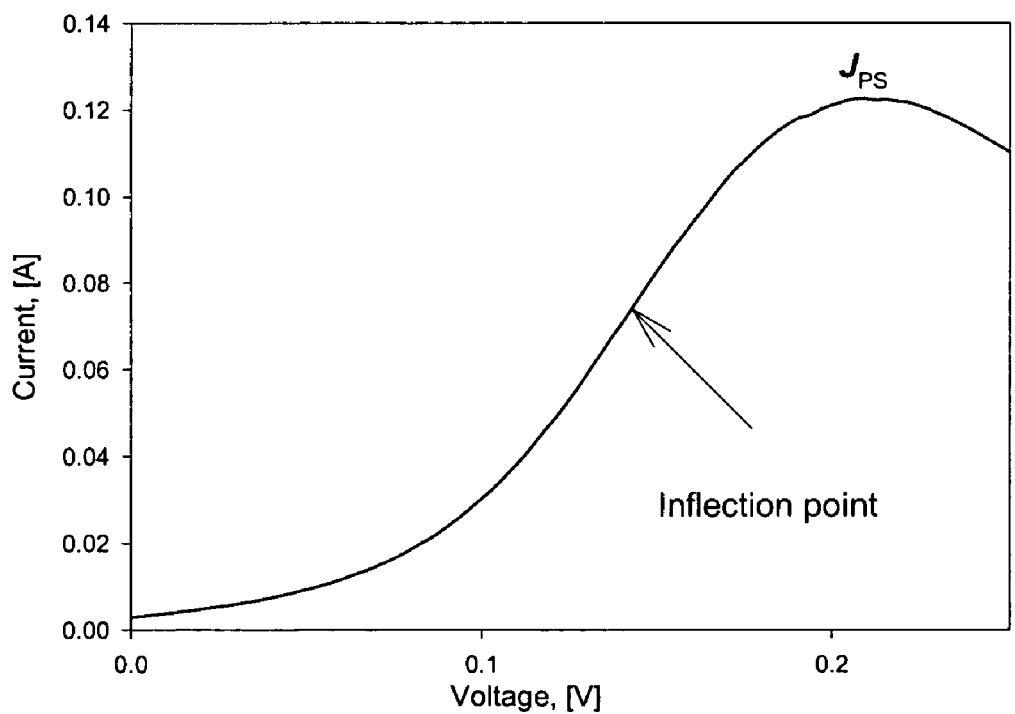
FIG. 5b is a magnified portion of the IV curve as in FIG. 5a around the point of inflection.

According to a further aspect of an exemplary illustrative implementation, the active monitoring of the electrochemical etching process is possible through monitoring the position of the inflection point of the IV curve of the electrolyte/semiconductor wafer system. According to said IV curve's inflection point current and voltage position measurements, active adjustment of some parameters of the electrochemical etching process can be implemented. For the exemplary case of an n-doped silicon/aqueous HF electrolyte system, the inflection point is indicated in FIG. 5b. Said parameters that can be actively changed according to the detected inflection point current and voltage position can include one or more parameters selected from the group consisting of applied current density, applied voltage, illumination intensity, temperature of the system, electrolyte composition (by means of the addition of fresh electrolyte chemicals into the bath electrolyte during the electrochemical etching process) and characteristic time (such as the period of a parameter modulation period, especially applicable in diameter- or porosity-modulated porous semiconductor layers). Similar curves can be obtained in many other electrolyte/semiconductor wafer combinations as well.

Figure 6A:
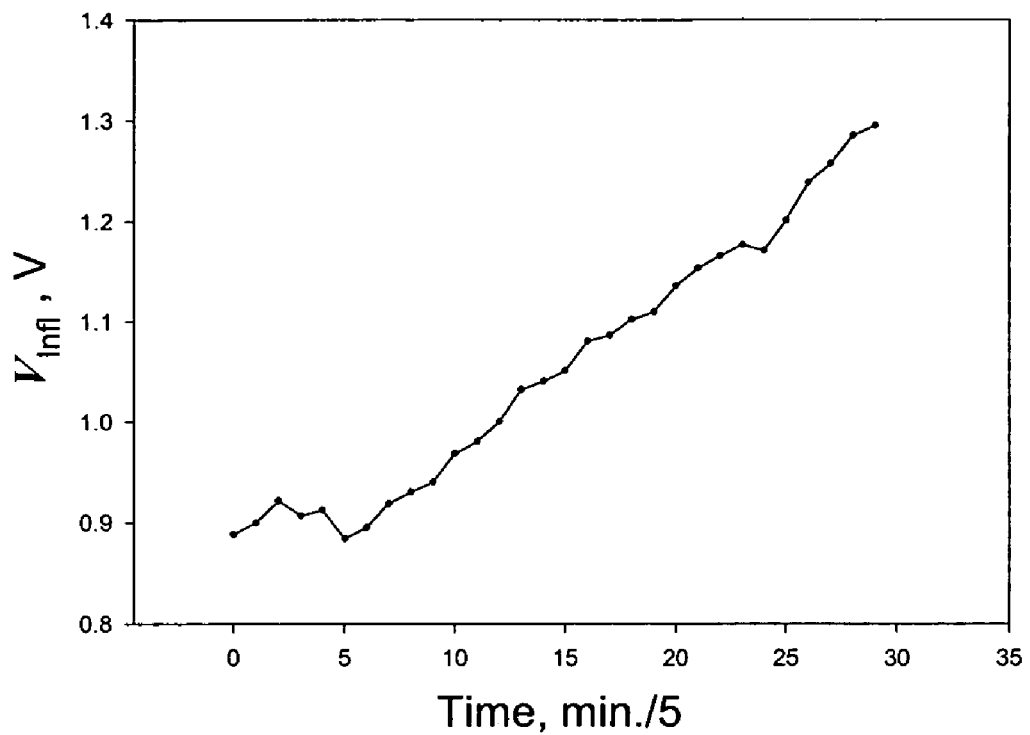
FIGS. 6(a) and (b) are exemplary plots of the experimentally recorded temporal evolution of the inflection point voltage (a) and current (b) positions for the exemplary case of an n-doped, (100)-oriented Si wafer and aqueous HF solution electrolyte system.
Figure 6B:
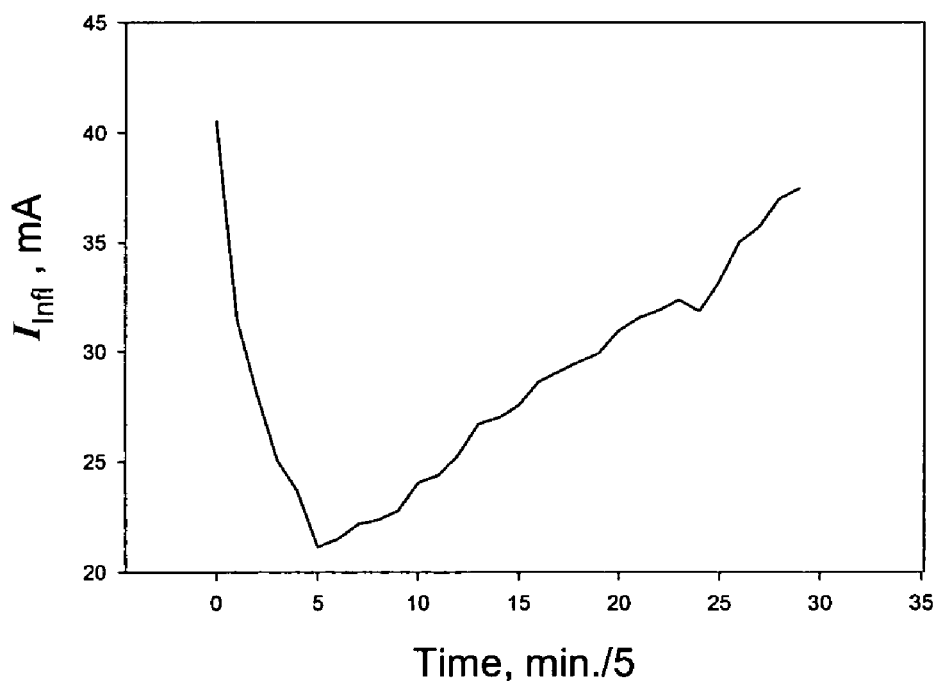

The inflection point voltage and current positions of IV curves are proportional to the $J_{PS}$ positions, and hence are also strongly dependent on the electrochemical etching parameters. This can serve for in-situ measurements to monitor the current state of the system and as a base of active adjustment of the etching parameters. Measurement and adjustment of the system parameters can be accomplished as follows: During the course of electrochemical etching, the IV curve can be recorded at certain times when the adjustment of the parameters or the system state monitoring is required. Following such measurements, mathematical analyses of the recorded data can provide the exact voltage and current position of the IV curve's inflection point. Said mathematical processing, as a nonlimiting illustrative example, can include curve fitting, polynomial interpolation or any other suitable method known to those skilled in the art. The illustrative, experimentally recorded temporal evolution of the inflection point voltage and current position for the exemplary case of an n-doped Si/aqueous HF solution electrolyte system is shown in FIGS. 6a and 6b. The current at the inflection point at any given moment of time, for example, is proportional to the pore etching rate, so the depth of etched porous semiconductor can be approximately determined at any given time. In addition, the decrease of the acid concentration due to the semiconductor dissolution reaction can be actively determined according to the known volume of dissolved semiconductor and adjusted by active injection of fresh electrolyte chemicals into the electrolyte bath during the anodization process. Other parameters of the electrochemical etching system can be determined and actively adjusted by the same method as well.

The nonlimiting, illustrative example of the method of electrochemical parameter closed-loop control during etching of modulated diameter pores in an n-doped, (100)-oriented Si wafer in the presence of back-side illumination is provided below. In such an example, the following abbreviations are used: $OF_n$ is an LED (Light Emitting Diode array that used for back-side illumination to provide positively conducting holes in the semiconductor) current offset (defining the averaged over the modulation period illumination intensity) at the time of $n^{th}$ point, $Amp_n$ is an LED current oscillation amplitude at the time of $n^{th}$ point, $\Delta t_n$ is an interval between two points at the time of the $n^{th}$ point, $Vinf_n$ is the voltage position of the inflection point at the time of $n^{th}$ point, $Iinf_n$ is the current position of the inflection point at the time of $n^{th}$ point, $A(t)$ is the minority carrier charge density at the pore tip at the time t, $Inten(x=0,t)$ is the illumination power density at the wafer back surface at the time t. The electrochemical etching system parameters in this illustrative case are actively adjusted according to the following formulas:

$$\Delta t_{n+1} = a \cdot \Delta t_0 \cdot \frac{Vinf_n}{Vinf_0}$$

$$OF_{n+1} = OF_0 \cdot e^{-\beta \cdot \sum_{j=0}^{n} Iinf_j \cdot \Delta t_j}$$

$$Amp_{n+1} = Amp_0 \cdot e^{-\beta \cdot \sum_{j=0}^{n} Iinf_j \cdot \Delta t_j}$$

where $\alpha$ and $\beta$ are constants that are determined by preliminary calibration runs and $\Delta t_0$, $OF_0$, $Amp_0$ are be provided as starting points.

Figure 7A:
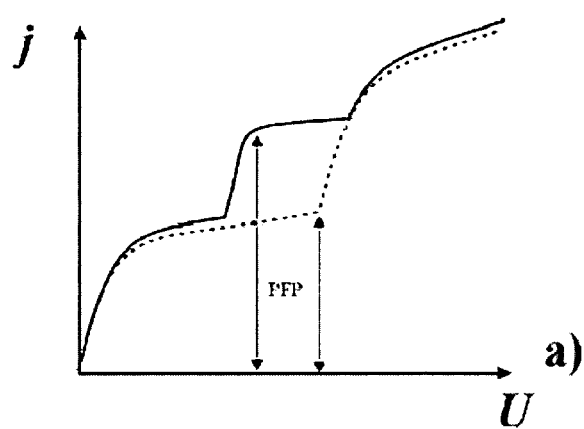
FIG. 7(a) shows an exemplary schematic IV curve for a III-V compound semiconductor (GaAs) for two sample conditions, with applied random surface roughness ("scratched") (solid line) and intact (dashed line)
Figure 7B:
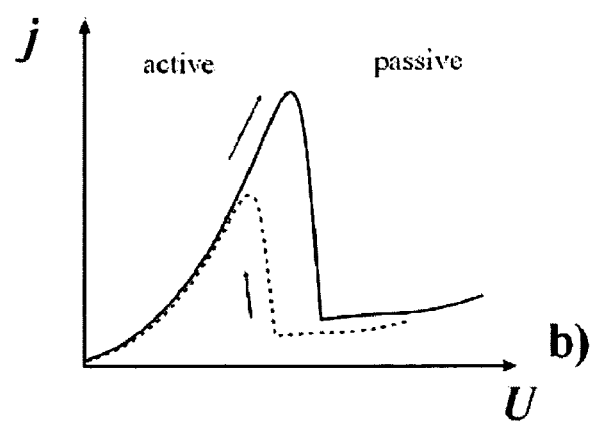
FIG. 7(b) shows an exemplary schematic IV curve for a III-V compound semiconductor (GaP) slow IV curve (oxide formation generates the peak and the hysteresys effect in the IV-curves.

In contrast to the example of the Si case, where at least in low-doped Si, a very small junction leakage current (<1 $\mu A/cm^3$) can be maintained for voltages as large as 100 V, the reverse current in III-V compounds increases steeply with increasing voltage, and pores are formed on the surface as soon as a critical potential, the so-called pore formation potential (PFT), is reached. The pore formation potential is also called the breakdown potential; it occurs usually at 2-3 V for moderately doped samples. Schmuki et al. measured the current-voltage curves of samples with intact and diamond scribe-scratched surfaces [P. Schmuki, L. E. Erickson, D. J. Lockwood, J. W. Fraser, G. Champion, and H. J. Labbe, Appl. Phys. Lett. 1998, 72, 1039]. The scratched samples showed a PFP significantly lower than the PFP of the intact sample. The PFP thus can be viewed as the defect-triggered onset of junction breakdown in areas of locally large electrical field strengths. A schematic representation of the IV curves with an intact and scratched surface of the GaAs sample is presented in FIG. 7a. In contrast to the case of n-GaAs, Tjerkstra et al. [R. W. Tjerkstra, J. Gomesz-Rivas, D. Vanmaekelbergh, and J. J. Kelly, Electrochem. Solid-State Lett. 2002, 5, G32] reported for n-GaP (in $H_2SO_4$ aqueous electrolytes) that the current does not increase infinitely after the PFP has been reached, but goes through a maximum at a more positive potential, after which it decreases rapidly to a lower value that shows only a weak potential dependence. Such peaks are usually due to oxide formation, making current flow difficult. Since the oxide formed in the process has to be dissolved before current can flow again, the peak voltage depends somewhat on the voltage scan rate and the IV curves show a hysteresis (see FIG. 7b).

According to this non-limiting illustrative implementation, said IV curve features in the case of III-V compounds can be used in the same manner as the $J_{PS}$ peak or IV curve inflection point, as in the previous aspects of this exemplary implementation, to monitor the electrochemical etching parameters and to actively adjust said parameters based on the results of monitoring, in order to implement the closed-loop control.

While the technology herein has been described in connection with exemplary illustrative non-limiting implementations, the invention is not to be limited by the disclosure. The invention is intended to be defined by the claims and to cover all corresponding and equivalent arrangements whether or not specifically disclosed herein.

We claim:

1. A method of providing closed-loop control over an electrochemical etching process during porous semiconductor fabrication comprising:

providing a substrate wafer of single-crystal semiconductor having a first surface and a second surface, disposing the substrate wafer in an electrochemical etching apparatus comprising the semiconductor wafer as an anode, electrolyte, and counter electrode as a cathode, executing an electrochemical etching process wherein at least part of said first surface of the semiconductor wafer is exposed to electrolyte to thereby etch high aspect ratio pores in said semiconductor wafer, setting the electrochemical etching parameters to the electrochemical etching system comprising the substrate wafer, electrolyte and counter electrode, and performing the electrochemical etching process at over a process time period, measuring the value of the resistance of the electrochemical etching system at least once during the electrochemical process time period, and adjusting the electrochemical etching parameters according to the measurements of the resistivity of the electrochemical etching system at least once during the electrochemical process time period, wherein said electrochemical etching adjustment parameters are one or more selected from the group consisting of electrical current density, illumination intensity, temperature of the electrolyte, applied voltage, the electrochemical etching process type, temporal characteristics of any or all of said parameters, and the electrochemical total process time period, wherein said adjustment of the electrochemical etching parameters is performed according to the measured relative change in the resistance of the electrochemical etching system in real time, and wherein the electrochemical etching parameter that is adjusted is the temporal characteristic of the applied electrical current density, more particularly said electrical current density varies in time according to a mathematical function having a characteristic temporal interval, said temporal interval of the mathematical function being adjusted according to the formula $T(t)=T(t_0)\cdot R(t, I)/R(t_0, I)$, wherein $R(t, I))=U(t)/I$ is the measured resistance of the electrochemical etching system at time t taken at applied current density I, T is a temporal interval of said mathematical function, wherein values $T(t_0)$, I and $t_0$ are set preliminary to the start of the electrochemical etching process.

2. A method of providing closed-loop control over an electrochemical etching process during porous semiconductor fabrication comprising:

providing a substrate wafer of single-crystal semiconductor having a first surface and a second surface, disposing the substrate wafer in an electrochemical etching apparatus comprising the semiconductor wafer as an anode, electrolyte, and counter electrode as a cathode, executing an electrochemical etching process wherein at least part of said first surface of the semiconductor wafer is exposed to electrolyte to thereby etch high aspect ratio pores in said semiconductor wafer, setting the electrochemical etching parameters to the electrochemical etching system comprising the substrate wafer, electrolyte and counter electrode, and performing the electrochemical etching process at over a process time period, measuring the value of the resistance of the electrochemical etching system at least once during the electrochemical process time period, and adjusting the electrochemical etching parameters according to the measurements of the resistivity of the electrochemical etching system at least once during the electrochemical process time period, wherein said electrochemical etching adjustment parameters are one or more selected from the group consisting of electrical current density, illumination intensity, temperature of the electrolyte, applied voltage, the electrochemical etching process type, temporal characteristics of any or all of said parameters, and the electrochemical total process time period, and wherein said adjustment of the electrochemical etching parameters is performed according to the measured absolute amplitude value of the resistivity of the electrochemical etching system.

3. The method of claim 2 wherein the said adjusted electrochemical etching parameter is the temporal characteristic of the applied electrical current density, and more particularly said electrical current density varies in time according to a mathematical function having a characteristic temporal interval, and further, said temporal interval of said mathematic function is adjusted according to the formula $T(t)=T_0 \cdot R(t, I)/R_0$, wherein $R(t, I))=U(t)/I$ is the measured resistance of the electrochemical etching system at time t taken at applied current density I, T is a temporal interval, $T_0$ is the preliminarily set starting temporal interval, $R_0$ is the preliminarily set reference number, and I is the preliminarily set current density.

4. The method of claim 3 wherein said the adjusted electrochemical etch parameter is the temporal characteristic of the applied electrical current density, more particularly said electrical current density varying in time according to some mathematic function having a characteristic temporal interval, said temporal interval being adjusted according to the formula $T(t)=T_0 \cdot f_0/f(t)$, wherein $f(t)$ is the measured frequency of voltage self-oscillations of the electrochemical etching system at time t, T is a temporal interval, $T_0$ is a preliminarily set starting temporal interval and $f_0$ is a preliminarily set reference number.

5. A method of providing closed-loop control over an electrochemical etching process during porous semiconductor fabrication comprising:

providing a substrate wafer of single-crystal semiconductor having a first surface and a second surface, disposing the substrate wafer in an electrochemical etching apparatus comprising the semiconductor wafer as an anode, electrolyte, counter electrode as a cathode and necessary hardware and/or software; wherein at least part of said first surface of the semiconductor wafer is exposed to electrolyte, setting the electrochemical etching parameters to the electrochemical etching system comprising the substrate wafer, electrolyte and counter electrode, and performing the electrochemical etching process at over some temporal length, measuring the voltage oscillation frequency of the electrochemical etching system at least once during the electrochemical total process temporal length by setting the system to galvanostatic process conditions for at least some period of time and analyzing the temporal characteristics of the voltage needed by the electrochemical system in order to achieve a set level of electrical current density, and adjusting the electrochemical etching parameters according to the measurements of the voltage oscillation frequency of the electrochemical etching system at least once during the electrochemical total process temporal length.

6. The method of claim 5, wherein said substrate wafer is a p-type doped silicon wafer and said electrolyte is a fluoride-containing, acidic electrolyte.

7. The method of claim 6, wherein said silicon wafer has a resistivity in the range of 1 to 1000 Ωcm, a crystal orientation selected from the group consisting of (100) and (111), and the fabricated porous semiconductor is a macroporous silicon.

8. The method of claim 5, wherein said substrate wafer is a III-V compound semiconductor wafer with a doping density in the range of $10^{16}$ to $10^{18}$ $cm^{-3}$, crystal orientation selected from the group consisting of (100) and (111), the electrolyte is an acidic electrolyte, and the resultant fabricated porous semiconductor is a macroporous III-V semiconductor material.

9. The method of claim 8, wherein said III-V compound semiconductor is selected from the group consisting of InP, GaAs and GaP.

10. The method of claim 5, wherein said electrochemical etching parameters are one or more parameters selected from the group consisting of electrical current density, illumination intensity, temperature of the electrolyte, applied voltage, the type of the electrochemical etching process, the temporal characteristics of any or all of said parameters, and the electrochemical total process temporal length.

11. The method of claim 10 wherein said type of electrochemical etching process type is selected from the group consisting of potentiostatic and galvanostatic processes and further a process consisting of at least one temporal period of potentiostatic process and at least one temporal period of galvanostatic process.

12. The method of claim 5, wherein said voltage oscillation frequency measurements are performed by fixing all the electrochemical etching parameters except the applied voltage, recording the temporal dependence of the applied voltage required in order to reach the set value of applied current density and applying mathematical processing to extract the voltage oscillation frequency.

13. The method of claim 5, wherein said voltage oscillation frequency measurements are performed by fixing all the electrochemical etching parameters and by applying the small perturbation to the applied current density in a form of the periodical function with the frequency in the range of 0.001 Hz to 100 Hz, varying the frequency of said perturbation, recording the response of the electrochemical etching system as a form of frequency-dependent voltage, and extracting the voltage self-oscillation frequency by mathematical processing of the recorded data.

14. The method of claim 13 wherein said response of the system is extracted with a lock-in amplifier or other phase-locked method.

15. The method of claim 13 wherein said variation of frequency of the current density perturbation is performed around one of the higher harmonics of the voltage self-oscillation resonance.

16. The method of claim 13 wherein said voltage self-oscillation frequency is determined from the amplitude and phase of the frequency response from the electrochemical etching system.

17. The method of claim 5, wherein in said electrochemical etching apparatus further contains a reference electrode immersed at least partially into the electrolyte; said electrode used in measurements of the frequency of voltage self-oscillations of the electrochemical etching system as a part of an electrical circuit distinct from the electrical circuit containing the electrochemical etching system anode and cathode.

18. The method of claim 5 wherein said adjustable electrochemical etching parameters are one or more selected from the group consisting of electrical current density, illumination intensity, temperature of the electrolyte, voltage, the type of the electrochemical etching process, temporal characteristics of any or all of said parameters, plus the electrochemical total process time period.

19. The method of claim 18 wherein said electrochemical etching parameters are adjusted automatically by means of appropriate software and/or hardware.

20. The method of claim 5 wherein said adjustment of the electrochemical etching parameters is performed according to the measured relative change in the voltage self-oscillation frequency of the electrochemical etching system between measurement times.

21. The method of claim 20 wherein the adjusted electrochemical etching parameter is the temporal characteristic of the applied electrical current density, more particularly said electrical current density varying in time according to some mathematic function having a characteristic temporal interval, said temporal interval of said mathematical function being adjusted according to the formula $T(t)=T(t_0) \cdot f(t_0)/f(t)$, wherein $f(t)$ is the measured voltage self-oscillation frequency of the electrochemical etching system at time t, T is a temporal interval of said mathematic function and $t_0$ is the temporal position of the point of reference during the electrochemical etching process, wherein values $T(t_0)$, and $t_0$ are set preliminary to the electrochemical etching process.

22. The method of claim 5 wherein said adjustment of the electrochemical etching parameters is performed according to the measured absolute value of the voltage self-oscillation frequency of the electrochemical etching system.

23. A method of providing closed-loop control over an electrochemical etching process during porous semiconductor fabrication comprising:
  providing a substrate wafer of single-crystal semiconductor having a first surface and a second surface,
  disposing the substrate wafer in an electrochemical etching apparatus comprising the semiconductor wafer as an anode, electrolyte, counter electrode as a cathode and necessary hardware and/or software, wherein at least part of said first surface of the semiconductor wafer is exposed to electrolyte,
  setting the electrochemical etching parameters to the electrochemical etching system comprising the semiconductor wafer as an anode, electrolyte, and counter electrode as a cathode, and performing the electrochemical etching process over a total process temporal period,
  measuring and storing the current-voltage curve of the electrochemical etching system at least once during the electrochemical total process temporal period, and
  adjusting the electrochemical etching parameters according to the voltage and current values of a characteristic feature of the measured current-voltage curve of the electrochemical etching system at least once during the electrochemical process temporal length,
  wherein said current-voltage curve measurements are performed by fixing all the electrochemical etching parameters at preliminarily set values, except for the current and applied voltage, tuning the applied voltage within a range, and measuring and recording the current obtained at each value of applied voltage.

24. A method of providing closed-loop control over an electrochemical etching process during porous semiconductor fabrication comprising:
  providing a substrate wafer of single-crystal semiconductor having a first surface and a second surface,
  disposing the substrate wafer in an electrochemical etching apparatus comprising the semiconductor wafer as an anode, electrolyte, counter electrode as a cathode and necessary hardware and/or software, wherein at least part of said first surface of the semiconductor wafer is exposed to electrolyte,
  setting the electrochemical etching parameters to the electrochemical etching system comprising the semiconductor wafer as an anode, electrolyte, and counter electrode as a cathode, and performing the electrochemical etching process over a total process temporal period,
  measuring and storing the current-voltage curve of the electrochemical etching system at least once during the electrochemical total process temporal period, and
  adjusting the electrochemical etching parameters according to the voltage and current values of a characteristic feature of the measured current-voltage curve of the electrochemical etching system at least once during the electrochemical process temporal length,
  wherein said characteristic feature of the current-voltage curve is the first peak of current and the current and voltage positions of said first peak are determined by mathematically processing the measured current-voltage curve.

25. A method of providing closed-loop control over an electrochemical etching process during porous semiconductor fabrication comprising:
  providing a substrate wafer of single-crystal semiconductor having a first surface and a second surface,
  disposing the substrate wafer in an electrochemical etching apparatus comprising the semiconductor wafer as an anode, electrolyte, counter electrode as a cathode and necessary hardware and/or software, wherein at least part of said first surface of the semiconductor wafer is exposed to electrolyte,
  setting the electrochemical etching parameters to the electrochemical etching system comprising the semiconductor wafer as an anode, electrolyte, and counter electrode as a cathode, and performing the electrochemical etching process over a total process temporal period,
  measuring and storing the current-voltage curve of the electrochemical etching system at least once during the electrochemical total process temporal period, and
  adjusting the electrochemical etching parameters according to the voltage and current values of a characteristic feature of the measured current-voltage curve of the electrochemical etching system at least once during the electrochemical process temporal length,
  wherein said characteristic feature of the current-voltage curve is the curve inflection point positioned between zero voltage and the first peak of current and the current and voltage positions of said inflection point are determined by mathematically processing the measured current-voltage curve.

26. A method of providing closed-loop control over an electrochemical etching process during porous semiconductor fabrication comprising:

providing a substrate wafer of single-crystal semiconductor having a first surface and a second surface, disposing the substrate wafer in an electrochemical etching apparatus comprising the semiconductor wafer as an anode, electrolyte, counter electrode as a cathode and necessary hardware and/or software, wherein at least part of said first surface of the semiconductor wafer is exposed to electrolyte, setting the electrochemical etching parameters to the electrochemical etching system comprising the semiconductor wafer as an anode, electrolyte, and counter electrode as a cathode, and performing the electrochemical etching process over a total process temporal period, measuring and storing the current-voltage curve of the electrochemical etching system at least once during the electrochemical total process temporal period, and adjusting the electrochemical etching parameters according to the voltage and current values of a characteristic feature of the measured current-voltage curve of the electrochemical etching system at least once during the electrochemical process temporal length, wherein said adjustment of the electrochemical etching parameters is performed according to the measured relative change in the current and voltage positions of a characteristic feature on the measured current-voltage curve of the electrochemical etching system.

27. A method of providing closed-loop control over an electrochemical etching process during porous semiconductor fabrication comprising:

providing a substrate wafer of single-crystal semiconductor having a first surface and a second surface, disposing the substrate wafer in an electrochemical etching apparatus comprising the semiconductor wafer as an anode, electrolyte, counter electrode as a cathode and necessary hardware and/or software, wherein at least part of said first surface of the semiconductor wafer is exposed to electrolyte, setting the electrochemical etching parameters to the electrochemical etching system comprising the semiconductor wafer as an anode, electrolyte, and counter electrode as a cathode, and performing the electrochemical etching process over a total process temporal period, measuring and storing the current-voltage curve of the electrochemical etching system at least once during the electrochemical total process temporal period, and adjusting the electrochemical etching parameters according to the voltage and current values of a characteristic feature of the measured current-voltage curve of the electrochemical etching system at least once during the electrochemical process temporal length, wherein said adjustment of the electrochemical etching parameters is performed according to the measured absolute values of current and voltage positions of a characteristic feature on measured current-voltage curve of the electrochemical etching system.

\* \* \* \* \*